(12) United States Patent
Yoon et al.

(10) Patent No.: US 9,541,254 B2
(45) Date of Patent: Jan. 10, 2017

(54) LIGHT EMITTING DEVICE AND LIGHTING SYSTEM HAVING THE SAME

(71) Applicant: LG INNOTEK CO., LTD., Seoul (KR)

(72) Inventors: Yeo Chan Yoon, Seoul (KR); Jae Hwan Jung, Seoul (KR); Sung Joo Oh, Seoul (KR); Jin Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 636 days.

(21) Appl. No.: 13/835,075

(22) Filed: Mar. 15, 2013

(65) Prior Publication Data

US 2014/0071689 A1 Mar. 13, 2014

(30) Foreign Application Priority Data

Sep. 13, 2012 (KR) .......................... 10-2012-0101820

(51) Int. Cl.
| | |
|---|---|
| *F21V 7/00* | (2006.01) |
| *F21V 13/08* | (2006.01) |
| *F21V 13/04* | (2006.01) |
| *H01L 33/54* | (2010.01) |
| *H01L 33/60* | (2010.01) |

(Continued)

(52) U.S. Cl.
CPC ................. *F21V 7/00* (2013.01); *F21V 13/04* (2013.01); *F21V 13/08* (2013.01); *H01L 33/54* (2013.01); *H01L 33/60* (2013.01); *H01L 33/405* (2013.01); *H01L 33/56* (2013.01); *H01L 2224/48091* (2013.01); *H01L 2924/1301* (2013.01); *H01L 2933/0091* (2013.01)

(58) Field of Classification Search
CPC ............ F21V 7/00; F21V 13/08; F21V 13/04; H01L 33/54; H01L 33/60; H01L 2924/1301; H01L 33/405; H01L 2224/48091; H01L 2933/0091; H01L 33/56; H01L 2924/00014; H01L 2924/00
See application file for complete search history.

(56) References Cited

U.S. PATENT DOCUMENTS

| | | | |
|---|---|---|---|
| 6,111,272 A | 8/2000 | Heinen | |
| 7,932,531 B2 * | 4/2011 | Lin et al. | ........................ 257/98 |

(Continued)

FOREIGN PATENT DOCUMENTS

| | | |
|---|---|---|
| DE | 10 2007 029 369 A1 | 1/2009 |
| DE | 10 2010 003 321 A1 | 9/2011 |

(Continued)

*Primary Examiner* — Stephen F Husar
*Assistant Examiner* — Danielle Allen
(74) *Attorney, Agent, or Firm* — Ked & Associates, LLP

(57) ABSTRACT

Disclosed are a light emitting device. The light emitting device includes a body having a cavity; a plurality of lead frames in the cavity; a light emitting chip; a first molding member having a first metal oxide material around the light emitting chip; and a second molding member having a second metal oxide material on the first molding member and the light emitting chip, wherein the light emitting chip includes a reflective electrode layer under a light emitting structure, wherein a top surface of the first molding member extends from a region between a top surface of the light emitting chip and a lateral side of the reflective electrode layer at a predetermined curvature, and wherein a bottom surface of the second molding member includes a curved surface which is convex toward the first molding member.

20 Claims, 13 Drawing Sheets

(51) Int. Cl.
*H01L 33/56* (2010.01)
*H01L 33/40* (2010.01)

(56) References Cited

U.S. PATENT DOCUMENTS

| 2002/0017652 | A1  | 2/2002  | Illek et al. | 257/95 |
| 2011/0241028 | A1* | 10/2011 | Park et al.  | 257/88 |
| 2013/0140580 | A1  | 6/2013  | Wirth et al. | 257/76 |

FOREIGN PATENT DOCUMENTS

| DE | 10 2010 038 396 A1 | 1/2012 |
| EP | 0 905 797 A2       | 1/1999 |
| WO | WO 02/13281 A1     | 2/2002 |
| WO | WO 2011/117052 A1  | 9/2011 |

* cited by examiner

FIG. 15

| Case | 1st Mold | | 2nd Mold | | Lux | lm |
|---|---|---|---|---|---|---|
| | Silicon | TiO₂ | Silicon | SiO₂ Ratio | | |
| Case #1  | A | Not-added | A | Clear Mold | 43.5 | 233.923 |
| Case #2  | | | | 7.5%  | 45.9 | 235.396 |
| Case #3  | | | | 10.0% | 45.1 | 235.024 |
| Case #4  | | | | 12.5% | 45.6 | 235.843 |
| Case #5  | | | B | Clear | 46.5 | 240.904 |
| Case #6  | | | | 7.5%  | 46.7 | 240.904 |
| Case #7  | | | | 10.0% | 46.3 | 238.374 |
| Case #8  | | | | 12.5% | 47.6 | 241.648 |
| Case #9  | | Added | A | Clear | 48.9 | 247.007 |
| Case #10 | | | | 7.5%  | 49.8 | 246.858 |
| Case #11 | | | | 10.0% | 51.1 | 250.208 |
| Case #12 | | | | 12.5% | 51.0 | 250.915 |
| Case #13 | | | B | Clear | 49.7 | 248.496 |
| Case #14 | | | | 7.5%  | 49.3 | 248.682 |
| Case #15 | | | | 10.0% | 50.2 | 248.794 |
| Case #16 | | | | 12.5% | 49.2 | 248.868 |

FIG. 16

| Case | 1st Mold | | 2nd Mold | | X-X | X-Y |
|---|---|---|---|---|---|---|
| | Silicon | TiO$_2$ | Silicon | SiO$_2$ Ratio | | |
| Case #1 | A | Not-added | A | Clear Mold | 120.80 | 115.94 |
| Case #2 | | | | 7.5% | 117.07 | 117.10 |
| Case #3 | | | | 10.0% | 116.98 | 113.32 |
| Case #4 | | | | 12.5% | 116.46 | 116.47 |
| Case #5 | | | B | Clear | 118.45 | 118.34 |
| Case #6 | | | | 7.5% | 117.80 | 117.50 |
| Case #7 | | | | 10.0% | 117.71 | 117.60 |
| Case #8 | | | | 12.5% | 116.95 | 116.98 |
| Case #9 | | Added | A | Clear | 118.25 | 118.05 |
| Case #10 | | | | 7.5% | 116.01 | 116.20 |
| Case #11 | | | | 10.0% | 115.96 | 115.84 |
| Case #12 | | | | 12.5% | 116.78 | 116.68 |
| Case #13 | | | B | Clear | 117.73 | 116.92 |
| Case #14 | | | | 7.5% | 118.02 | 117.76 |
| Case #15 | | | | 10.0% | 116.43 | 110.24 |
| Case #16 | | | | 12.5% | 116.99 | 116.15 |

LIGHT EMITTING DEVICE AND LIGHTING SYSTEM HAVING THE SAME

The present application claims priority under 35 U.S.C. §119(a) of Korean Patent Application No. 10-2012-0101820 filed on Sep. 13, 2012, which is hereby incorporated by reference in its entirety.

BACKGROUND

The embodiment relates to a light emitting device and a lighting system having the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a phosphor substance.

In addition, the LED generates the light by using the potential gap of the semiconductor device, so the LED is advantageous as compared with conventional light sources in terms of life span, response characteristics, and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

The embodiment provides a light emitting device, in which a top surface of a first molding member having a first metal oxide material around a light emitting chip is located lower than a top surface of the light emitting chip.

The embodiment provides a light emitting device including a first molding member around a light emitting chip and a second molding member disposed on the first molding member, in which a bottom surface of the second molding member includes a curved surface convexed in the direction of the first molding member.

The embodiment provides a light emitting device including a first molding member extending at a predetermined curvature from a region between a reflective electrode layer and a top surface of a light emitting chip.

The embodiment provides a light emitting device, in which an interfacial surface between a first molding member and a second molding member exists in a region between a light emitting chip and a lateral side of a cavity and a lowest point of the interfacial surface is formed at a depth corresponding to 30% or more of a thickness of the light emitting chip from a horizontal line segment with a top surface of the light emitting chip.

The embodiment provides a light emitting device which includes a first molding member having a first metal oxide material around a light emitting chip and a second molding member having a second metal oxide material on the first molding member and the light emitting chip.

The embodiment provides a lighting system including a light emitting device having improved light extraction efficiency.

A light emitting device according to the embodiment includes: a body having a cavity; a plurality of lead frames in the cavity; a light emitting chip on at least one of the lead frames; a first molding member around the light emitting chip, in which a first metal oxide material is added to the first molding member; and a second molding member on the first molding member and the light emitting chip, in which a second metal oxide material is added to the second molding member, wherein the light emitting chip includes: a light emitting structure including a plurality of compound semiconductor layers; and a reflective electrode layer under the light emitting structure, wherein a top surface of the first molding member extends from a region between a top surface of the light emitting chip and a lateral side of the reflective electrode layer at a predetermined curvature, and wherein a bottom surface of the second molding member corresponding to the top surface of the first molding member includes a curved surface which is convex toward the first molding member.

A light emitting device according to the embodiment includes: a body having a cavity; a plurality of lead frames in the cavity; a light emitting chip on at least one of the lead frames; a first molding member around the light emitting chip, in which a first metal oxide material is added to the first molding member; and a second molding member on the first molding member and the light emitting chip, in which a second metal oxide material is added to the second molding member, wherein the light emitting chip includes: a light emitting structure including a plurality of compound semiconductor layers; and a reflective electrode layer under the light emitting structure, wherein a top surface of the first molding member is disposed lower than a top surface of the light emitting chip, and wherein a difference in intervals between a highest point of the top surface of the first molding member and a bottom surface of the cavity and between a lowest point of the top surface of the first molding member and the bottom surface of the cavity is in a range of 30% to 70% of a thickness of the light emitting chip.

BRIEF DESCRIPTION OF THE DRAWINGS

FIG. 15 is a table illustrating a luminous flux and an illumination of a light emitting device having a molding member according to the embodiment and comparison example;

FIG. 16 is a view illustrating a directivity characteristic of a light emitting device having a molding member according to the embodiment and comparison example.

DETAILED DESCRIPTION OF THE EMBODIMENTS

Figure 1:
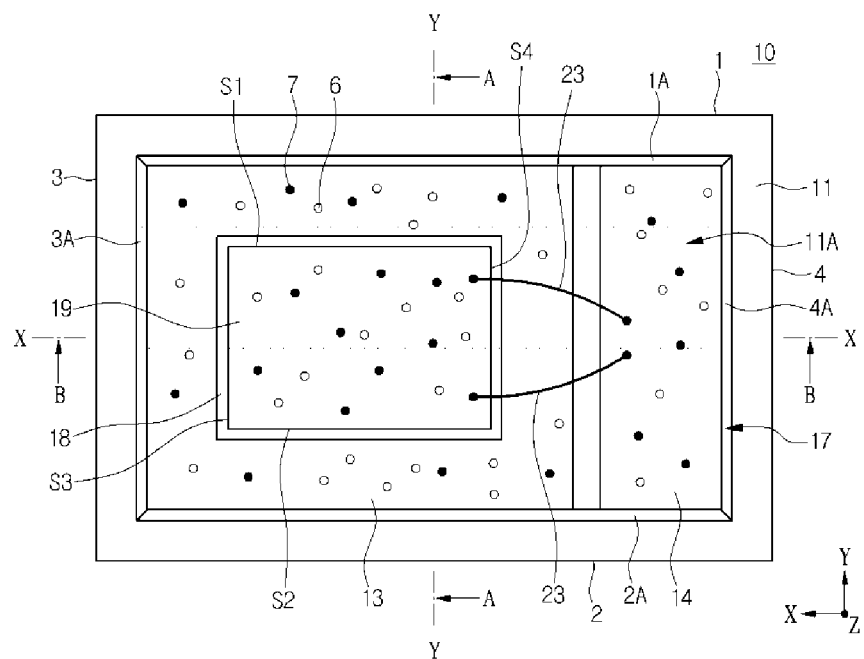
FIG. 1 is a plan view showing a light emitting device according to the first embodiment.

In the description of the embodiments, it will be understood that when a substrate, a frame, a sheet, a layer, or a pattern is referred to as being "on" another substrate, another frame, another sheet, another layer, or another pattern, it can be "directly" or "indirectly" on the other substrate, the other frame, the other sheet, the other layer, or the other pattern may also be present. In contrast, when a part is referred to as being "directly on" another part, the intervening layer is not present. Such a position of the layer has been described with reference to the drawings. The size of elements shown in the drawings may be exaggerated for the purpose of explanation and the size of elements does not utterly reflect an actual size.

Hereinafter, embodiments will be clearly comprehended by those skilled in the art with reference to accompanying drawings and the description of the embodiments. The thickness and size of each layer shown in the drawings may be exaggerated, omitted or schematically drawn for the purpose of convenience or clarity. In addition, the size of elements does not utterly reflect an actual size. The same reference numbers will be assigned to the same elements throughout the drawings.

Hereinafter, a light emitting device according to an embodiment will be described with reference to the accompanying drawings.

Figure 2:
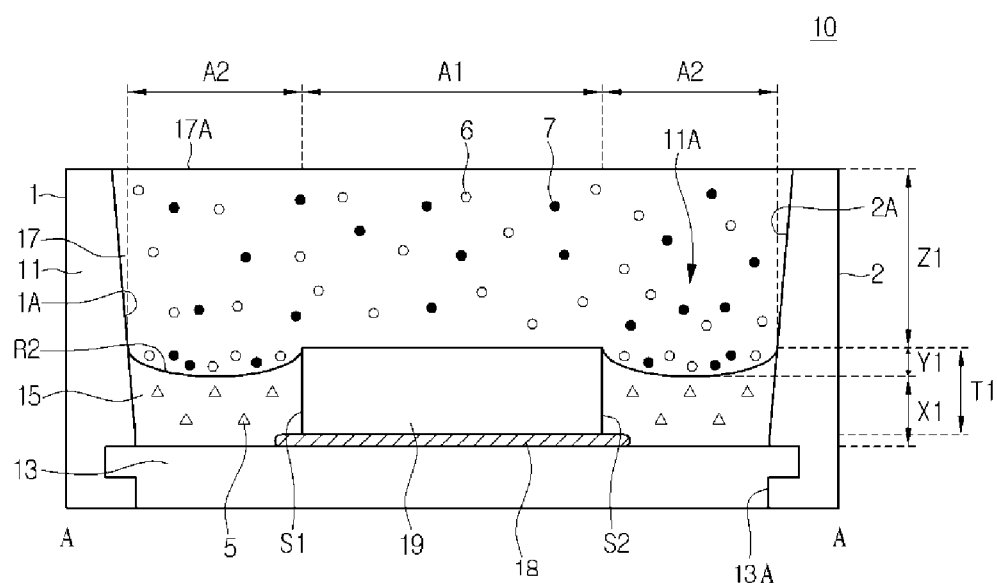
FIG. 2 is a sectional view taken along line A-A of FIG. 1.
Figure 3:
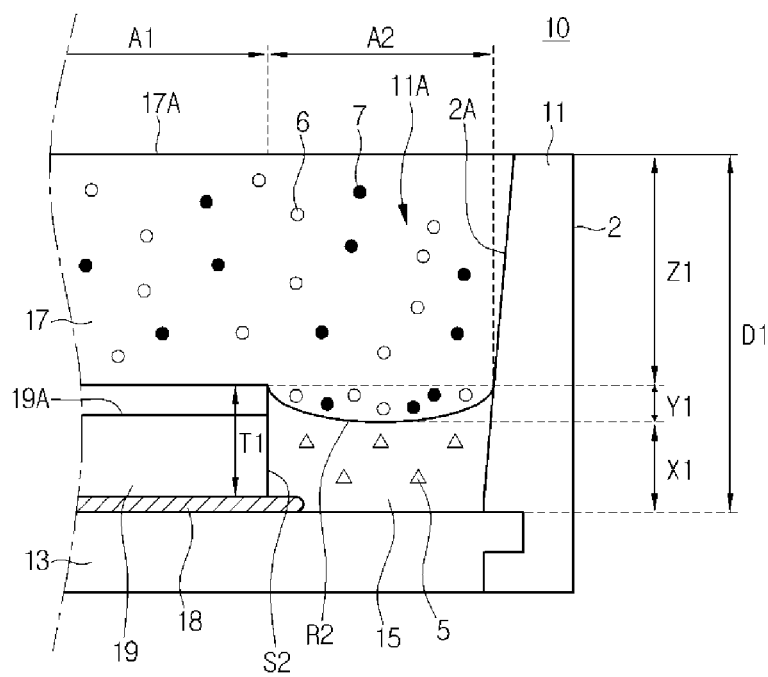
FIG. 3 is a partially enlarged view of FIG. 2.

FIG. 1 is a plan view showing a light emitting device according to the first embodiment, FIG. 2 is a sectional view taken along line A-A of FIG. 1, and FIG. 3 is a sectional view taken along line B-B of FIG. 1.

Referring to FIGS. 1 to 3, the light emitting device 10 includes a body 11 having a cavity 11A, a plurality of lead frames 13 and 14, a first molding member 15, a second molding member 17 and a light emitting chip 19.

The body 11 includes an insulating material or a conductive material. The body 11 may include at least one of a resin material, such as PPA (Polyphthalamide), Si, a metallic material, PSG (photosensitive glass), $Al_2O_3$, and PCB (Printed circuit board). For example, the body 11 may be formed of a resin material such as PPA, epoxy or silicon. The first and second molding members 15 and 17 may be formed of the same material as silicon, but the embodiment is not limited thereto.

When viewed in a plan view, the body 11 may be formed in a structure of a polygonal shape such as a triangular shape, a rectangular shape, or a pentagonal shape, a circular shape, or a shape having a curved edge.

The body 11 may include a plurality of lateral sides. For example, the body 11 may include four lateral sides 1 to 4. At least one of the lateral sides 1 to 4 may be vertical or inclined to a bottom surface of the body 11. The first to fourth lateral sides 1 to 4 are described as one example, in which the first and second lateral sides 1 and 2 are opposite to each other, and the third and fourth lateral sides 3 and 4 are adjacent to the first and second lateral sides 1 and 2 and opposite to each other. A width or a length of the first and second lateral sides 1 and 2 may be equal to or different from a width or a length of the third and fourth lateral sides 3 and 4, but the embodiment is not limited thereto.

The body 11 may include an upper portion which is open and a cavity 11A which has a cup shape or a recess shape. The lead frames 13 and 14 may be exposed through the bottom of the cavity 11A and the cavity 11A may have inner lateral sides 1A to 4A. The inner lateral sides 1A to 4A of the cavity 11A correspond to the lateral sides 1 to 4, respectively.

At least one of the inner lateral sides 1A to 4A of the cavity 11A may be vertical or inclined to top surfaces of the lead frames 13 and 14 the body 11, but the embodiment is not limited thereto.

The first lead frame 13 extends downward of the third inner lateral side 3A from the central region of the cavity 11A. The second lead frame 14 corresponds to the first lead frame 13 and extends downward of the fourth inner lateral side 4A in the cavity 11A.

The first and second lead frames 13 and 14 may include slots and/or holes and may have upper and bottom surfaces which are aligned on a horizontal plane. For example, the top surfaces of the first and second lead frames 13 and 14 may be aligned on the same horizontal plane.

The first lead frame 13 may be disposed under the third lateral side 3 of the body 11, or protrude outside from the third lateral side 3. The second lead frame 14 may be disposed under the fourth lateral side 4 of the body 11, or protrude outside from the fourth lateral side 4.

The thicknesses of the first and second lead frames 13 and 14 may be in the range of 0.15 mm to 0.8 mm, or preferably 0.5 mm to 0.4 mm. For instance, the first and second lead frames 13 and 14 may include at least one metal material of Ti, Cu, Ni, Au, Cr, Ta, Pt, Sn, Ag and P, and may be formed in a single metal layer or multiple metal layers. A thickness of the first lead frame 13 may be the same as that of the second lead frame 14, but the embodiment is not limited thereto.

A light emitting chip 19 is disposed on the first lead frame 13 exposed in the cavity 11A, is adhesive to the first lead frame 13 with an adhesive member 18. The adhesive member 18 includes a conductive material. The light emitting chip 19 is connected to the second lead frame 14 through a wire 23.

The light emitting chip 19 may selectively emit the light in the range of the ultraviolet band to the visible band. For example, one of a red LED chip, a blue LED chip, a green LED chip and a yellow green LED chip may be selected as the light emitting chip 19. The light emitting chip 19 may include at least one of group III-V compound semiconductors and group II-VI compound semiconductors. One or plural light emitting chips 19 may be disposed in the cavity 11A, but the embodiment is not limited thereto. The light emitting chip may be a vertical-type chip which includes the anode and cathode electrodes disposed in the longitudinal direction, respectively, a flip chip which includes the anode and cathode electrodes disposed in one direction, or a lateral-type chip which includes the anode and cathode electrodes adjacent to each other. Further, the light emitting chip 19 may have the horizontal and vertical lengths in the range of 0.5 mm×0.5 mm to 1.5 mm×1.5 mm, or preferably, 0.5 mm×0.5 mm to 1 mm×1 mm, and the embodiment is not limited thereto. The thickness of the light emitting chip 19 may be in the range of 100 μm to 300 μm.

A protective chip such as a Zener diode, a thyristor, or a TVS (transient voltage suppression) may be disposed on at least one of the lead frames 13 and 14, and the embodiment is not limited thereto.

The first molding member 15 is disposed around the light emitting chip 19 to make contact with all lateral sides S1 to S4 of the light emitting chip 19. The first molding member 15 includes a material which results from adding a first metal oxide material 5 to silicon material. The first metal oxide material 5 is a high refractive material and includes $TiO_2$. An amount of the first metal oxide material 5 added to the first molding member 15 may be in the range of 5 wt % to 15 wt %, or preferably 10 wt % to 15 wt %. As another example, the first metal oxide material 5 may be added in the range of 10 wt % to 12.5 wt %. The silicon material of the first molding member 15 has a refractive index in the range of 1.51 to 1.55. A silicon material having good-adhesive strength to the lead frame 13 and the body 11 may be used. Most light generated from the light emitting chip 19 is emitted in an upward direction, and 40% or less of generated light from the light emitting chip 19 is emitted in a lateral direction. The light that is emitted in the lateral direction of the light emitting chip 19 may be reflected using the first molding member 15, and most light generated from the light emitting chip 19 may be emitted through the top surface, according to the light emitting characteristic.

The first molding member 15 performs a function of a reflective layer which reflects 70% or more of the light emitted from the light emitting chip 19 by the first metal oxide material 5. Since the first molding member 15 is operated as the reflective layer, the light emitted from the light emitting chip 19 in the lateral direction may be effectively reflected. Since the first molding member 15 is adhesive to the lateral sides S1 to S4 of the light emitting chip 19, when considering the orientation characteristic of the light emitted from the light emitting chip 19, a beam distribution in a first axis direction X-X, which is a horizontal direction, is almost the same as a beam distribution in a second axis direction Y-Y which is a vertical direction.

Referring to FIGS. 2 and 3, the top surface of the first molding member 15 includes a curved surface. The curved surface is formed between the inner lateral sides 1A and 2A of the cavity 11A and the highest points of the lateral sides S1 and S2 of the light emitting chip 19. The highest point of the light emitting chip 19 is lower than a line which horizontally extends from the top surface of the light emitting chip 19, and the lowest point of the light emitting chip 19 is formed between the inner lateral sides 1A and 2A of the cavity 11A and the lateral sides S1 and S2 of the light emitting chip 19. A curvature of the curved surface may be in the range of 0.05 mm to 0.1 mm. The curvature may vary with viscosity of silicon material, impurity such as an added metal oxide material, and an interval between the inner lateral sides A1 and A2 and the lateral sides S1 and S2 of the light emitting chip 19.

The interfacial surface between the first and second molding members 15 and 17 has a shape of a concave curved surface. The lowest point of the concave curved surface may be lower than the top surface of the light emitting chip 19, and may be formed at a thickness in the range of 30% to 70% of the thickness T1 of the light emitting chip 19.

The first molding member 15 covers all lateral sides of the light emitting chip 19, so that the light emitted in the lateral direction of the light emitting chip 19 is reflected. Due to the concave curved surface of the first molding member 15, the contact area between the first and second molding members 15 and 17 may be improved, and may reflect re-incident light from the surface of the light emitting chip 19 in any other directions. Thus, due to the concave curved surface, the light extraction efficiency may be improved. Further, the concave curved surface of the first molding member 15 may perform a function of receiving moisture penetrated through the second molding member 17 such as a dam. Therefore, due to the depth of the concave curved surface of the first molding member 15, the adhesive strength, the light extraction efficiency, and the moisture penetration restraint effect may be improved.

Since the contact point of the top surface of the first molding member 15 with the light emitting chip 19 is formed at the same height as that of the top surface of the light emitting chip 19, the first molding member 15, the light emitting chip 19 and the second molding member 17 may be adhesive to each other at an edge area of the light emitting chip 19. Thus, the adhesive strength at the edge area of the light emitting chip 19 may be improved.

The depth of the top surface R2 of the first molding member 15, that is the lowest point of the curved surface is spaced apart from the inner lateral side 4A of the cavity 11A and the lateral side of the light emitting chip 19 and is formed at a predetermined depth Y1 from a line extending from the top surface of the light emitting chip 19. For example, the lowest point depth Y1 may be formed at a position in the range of 30% to 70% of the thickness T1 of the light emitting chip 19, that is a depth of $0.3T1 \leq X1 \leq 0.7T1$ or preferably $0.4T1 \leq X1 \leq 0.6T1$ from the top surface of the light emitting chip 19. The minimum thickness X1 of the first molding member 15 is an interval between the lowest point of the curved surface and the top surface of the lead frame 13, and for example, may be formed in the range of $0 \leq X1 \leq 0.7T1$, where T1 is in the range of 100 μm to 300 μm. The lowest thickness X1 of the first molding member 15 or the position of the lowest point may be determined by content and a material of the first metal oxide material 5, and the interval between the light emitting chip 19 and the inner lateral sides 1A and 2A of the cavity 11A, and when the position of the lowest point of the top surface of the first molding member 15 is lower, since the curvature or thickness X1 is out of the range, the light extraction efficiency or the moisture penetration restraint effect and the adhesive strength effect may be reduced.

The first molding member 15 reflects the light emitted from the light emitting chip 19 in the lateral direction from the lateral sides of the light emitting chip 19, so that the light extraction efficiency in an optical axis direction may be improved.

Figure 4:
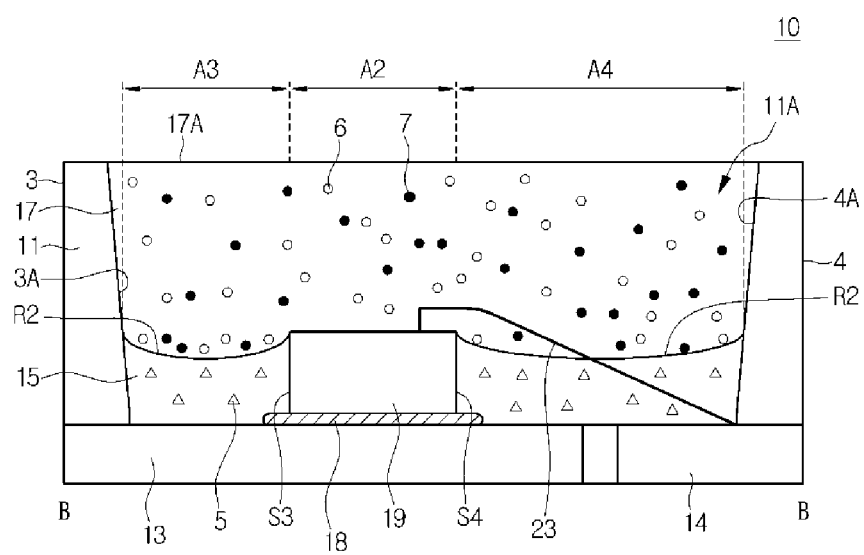
FIG. 4 is a sectional view taken along line B-B of FIG. 1.

As shown in FIGS. 2 and 4, the first molding member 15 is disposed in the second to fourth regions A2 to A4 except for the first region A1 of the light emitting chip 19. The second region A2 exists between both lateral sides S1 and S2 of the light emitting chip 19 and the first and second inner later sides 1A and 2A.

Referring to FIGS. 3 and 4, the third and fourth regions A3 and A4 may be regions between the lateral sides S3 and S4 of the light emitting chip 19 and the third and fourth inner lateral sides 3A and 4A of the cavity 11A. The top surface R2 of the first molding member 15 disposed in the fourth region A4 may have a curvature different from that of the top surfaces of the other regions, but the embodiment is not limited thereto.

As shown in FIG. 3, the light emitting chip 19 includes a reflective electrode layer 19A under the light emitting structure having a plurality of compound semiconductor layers.

The top surface R2 of the first molding member 15 may extend at a predetermined curvature from a region between the top surface of the light emitting chip 19 and a lateral side of the reflective electrode layer 19A. For example, the top surface R2 of the first molding member 15 may extend the top surface of the light emitting chip 19 to the inner lateral sides 1A and 2A of the cavity 11A.

The contact point of the top surface of the first molding member 15 with the light emitting chip 19 may have a height (X1+Y1) equal to or greater than that of the contact point of the top surface of the first molding member with the inner lateral sides 1A to 4A of the cavity 11A.

Here, the top surface R2 of the first molding member 15 may have a curvature in the range of 0.05 mm to 1 mm. The bottom surface of the second molding member 17 corresponding to the top surface R2 of the first molding member 15 may have a curvature equal to that of the top surface R2 of the first molding member 15.

The reflective electrode layer 19A is disposed in the interval of 15 µm or less. Thus, the first molding member 15 effectively reflects the lights reflected by the reflective electrode layer 19A and the active layer. Here, the top surface of the first molding member 16 is disposed over the reflective electrode layer 19A for light extraction efficiency, so that the efficiency of extracting light reflected by the reflective electrode layer 19A is improved.

The second molding member 17 makes contact with the light emitting chip 19 and the top surface R2 of the first molding member 15. Since the top surface R2 of the first molding member 15 is formed to be curved, a contact area of the first molding member 15 with the second molding member 17 may be increased, so that the adhesive strength between the first and second molding members 15 and 17 may be increased. The interfacial surface between the first and second molding members 15 and 17 is formed at the curvature of the curved surface and the lowest point of the interfacial surface is the lowest point of the top surface of the first molding member 15.

The second molding member 17 may be formed of a good adhesive material with the first molding member 15. For example, the second molding member 17 may be formed of the same material as that of the first molding member 15. The top surface of the second molding member 17 may be formed at a concave curvature and may have a curvature greater than that of the top surface of the first molding member 15.

The second molding member 17 makes contact with the top surface R2 of the first molding member 15 and the surface of the light emitting chip 19. The second metal oxide material 7 is added to the silicon material of the second molding member 17. The first and second metal oxide materials 5 and 7 may be formed of mutually different refractive indexes. For example, the first metal oxide material 5 may have a refractive index greater than that of the second metal oxide material 7.

The second metal oxide material 7 may be added to the second molding member 17 as a material having a high-curvature, and may include a different type of a material from the first metal oxide material 5 added to the first molding member 15. For example, the second metal oxide material 7 includes $SiO_2$.

As another example, the first metal oxide material 5 may include at least one of materials having a refractive index of 0.7 or less such as $Al_2O_3$, or MgO. The second metal oxide material 7 may include at least one of materials having a refractive index of 2.0 or above, such as $Ta_2O_5$ or $ZrO_2$. Further, any other materials may substitutes for the first and second metal oxide materials 5 and 7, but the embodiment is not limited thereto. The first and second metal material 5 and 7 is formed of a metal-oxide-based material defined a metal oxide substance, a metal oxide powder, a metal oxide particle, or a metal oxide pigment.

An amount of the second metal oxide material 7 added to the second molding member 17 may be in the range of 5 wt % to 15 wt %, preferably, 10 wt % to 15 wt %. As another example, the second metal oxide material 7 may be added at an amount of in the range of 10 wt % to 12.5 wt %. The second molding member 17 is a resin layer obtained by adding the second metal oxide material 7 to silicon material and is operated as a diffusion layer. The second molding member 17 allows the light, which is emitted vertically upward from the light emitting chip 19 through the first molding member 15, to spread at a uniform distribution. The content of the first metal oxide material 5 added to the first molding member 15 may be greater than that of the second metal oxide material 7 added to the second molding member 17.

The silicon material of the first molding member 15 has a refractive index in the range of 1.51 to 1.55. As the material of the first molding member 15, a material having a superior adhesive strength between the second molding member 17 and the body 11 may be used. When the first and second molding members 15 and 17 are formed of the same material, bubbles or interfacial de-adhesion in an interfacial surface between the first and second molding member 15 and 17 may be prevented.

The minimum thickness Z1 of the second molding member 17 is equal to the interval between the top surfaces of the light emitting chip 19 and the second molding member 17 and may be provided in the range of one to three times of the thickness T1 of the light emitting chip 19. For example, the minimum thickness Z1 of the second molding member 17 may be in the range of 150 µm to 260 µm. Thus, the depth D1 of the cavity 11A may be in the range of 300 µm to 500 µm, but the embodiment is not limited thereto. The minimum thickness Z1 of the second molding member 17 may be formed at least greater than that of the thickness T1 of the light emitting chip 19, so that color mixture of the light in the second molding member 17 may be improved. For example, a mixture of the blue color and yellow color lights from blue and yellow light emitting chips may be improved so that a white emitting device may be provided.

The second molding member 17 may be provided at a thickness greater than a minimum thickness X1 of the first molding member 15.

As another example, the first and second molding member 15 and 17 may be formed of mutually different silicon materials. For example, a refractive index difference between the materials of the first and second molding members 15 and 17 may be in the range of 0.070 to 0.090. For example, the silicon material of second molding member 17 may have a refractive index greater than that of the first molding member 15, which is in the range of 1.32 to 1.48.

Further, the first metal oxide material 5 may have a greater refractive index than that of the second metal oxide material 7. The second metal oxide material 7 may be formed of a material having a refractive index of 0.5 or more.

A phosphor 6 may be added to the second molding member 17. The phosphor 6 is a material converting a wavelength of light emitted on the light emitting chip 19. For example, the phosphor 6 may be selected from the group consisting of YAG, TAG, Silicate, Nitride, and Oxy-nitride.

The phosphor 6 may include at least one of red, yellow, green and blue phosphors, but the embodiment is not limited thereto.

The top surface 17A of the second molding member 17 may be formed in a plate shape, a concave shape, or a convex shape, but the embodiment is not limited thereto. The top surface of the second molding member 17 may be a light emitting surface. An optical lens may be disposed on the top surface of the second molding member 17. The optical lens may include a convex lens, a concave lens, and a convex lens having a specular reflection surface, but the embodiment is not limited thereto.

Meanwhile, the maximum density of the second metal oxide material 7 added to the second molding member 17 may be at a region between the lateral side of the light emitting chip 19 and the inner lateral sides 1A to 4A of the cavity 11A. The density of the second metal oxide material 7 in a region adjacent to the interfacial surface between the first and second molding members 15 and 17 may be greater than that of any other region.

Figure 5:
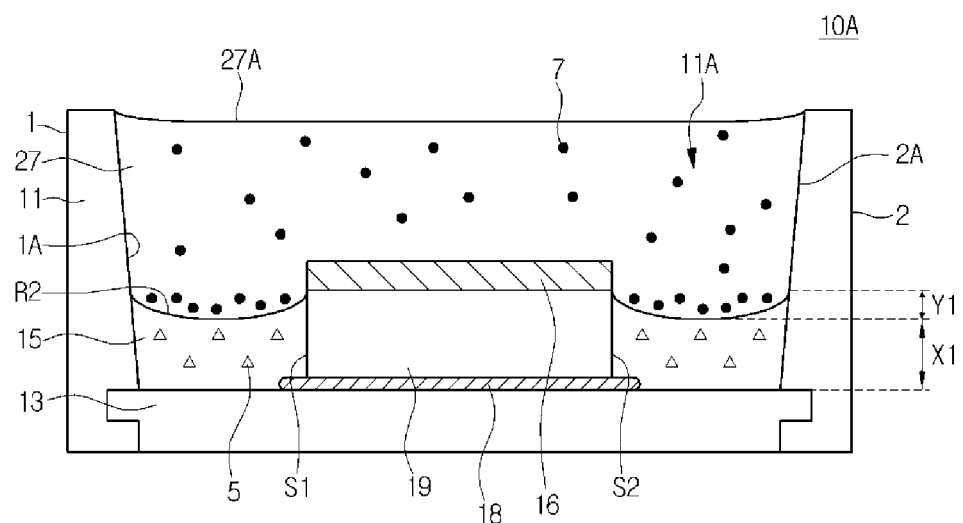
FIG. 5 is a side sectional view showing a light emitting device according to the second embodiment.

FIG. 5 is a sectional view showing a light emitting device according to the second embodiment. In the following description of the second embodiment, the description about the first embodiment will be incorporated by reference.

Referring to FIG. 5, the light emitting device 10A includes a body 11 having a cavity 11A, a lead frame 13, a first molding member 15, a second molding member 27, a phosphor layer 16 and a light emitting chip 19.

The phosphor layer 16 is disposed on the light emitting chip 19. The phosphor layer 16 may be formed by adding the phosphor described above to the transparent resin layer, and has a thickness in the range of 40 μm to 70 μm. If the thickness of the phosphor layer 16 is too thin, a mixed color of light is decreased, so that a white light with blue may be emitted. If the thickness of the phosphor layer 16 is too thick, the light extraction efficiency may be reduced.

The highest point of the curved surface which is the top surface of the first molding member 15 is placed at a position lower than that of a bottom surface of the phosphor layer 16, and the lowest point of the curved surface is placed at a position lower than that of the top surface of the light emitting chip 19. The curved surface of the first molding member 15 may be an interfacial surface between the first and second molding members 15 and 27.

The second molding member 27 makes contact with the first molding member 15, and the top surface and lateral side of the phosphor layer 16. The second molding member 27 does not make contact with the surfaces of the light emitting chip 19, so that the effect by thermal generated from the light emitting chip 19 may be reduced. The interfacial surface between the first and second molding members 15 and 27 may have the same curvature and depth as described in the first embodiment, and therefore refer to the description in the first embodiment.

A second metal oxide material 7 may be added to the second molding member 27, and any specific phosphor may not be added to the second molding member 27. The second molding member 27 respreads the light spread by the phosphor layer 16, so that the light may be effectively spread and emitted.

The top surface 27A of the second molding member 27 may be formed to be lower than the top surface of the body 11. An optical lens for a luminous flux control may be provided on the second molding member 27, but the embodiment is not limited thereto.

Figure 6:
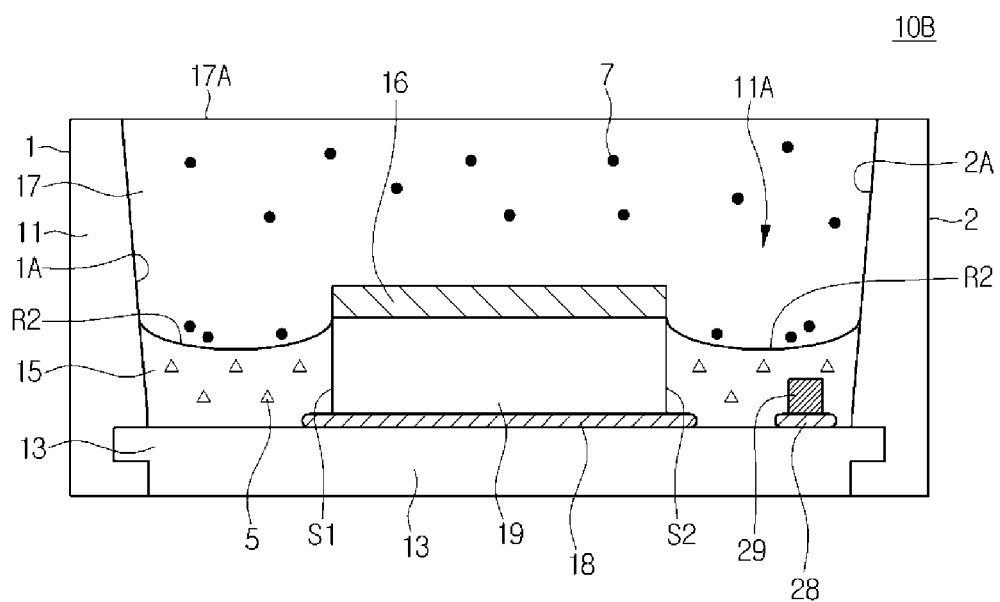
FIG. 6 is a side sectional view showing a light emitting device according to the third embodiment.

FIG. 6 is a side sectional view showing a light emitting device according to the third embodiment. In the following description of the third embodiment, the description about the first embodiment will be incorporated by reference.

Referring to FIG. 6, the light emitting device 10B includes a lead frame 13, a body 11, a first molding member 15, a second molding member 17, a phosphor layer 16, a protection chip 29 and a light emitting chip 19.

The protection chip 29 may be disposed under the first molding member 15. The protection chip 29 and the light emitting chip 19 may be disposed on the same lead frame 13 or mutually different frames. For example, the protection chip 29 may be disposed on the first lead frame 13 or the second lead frame 14 in FIG. 1. The protection chip 29 may be adhesive to the first lead frame 13 with an adhesive member 28, but this electric connecting scheme may be changed.

The first molding member 15 is disposed around the light emitting chip 19 as a reflective layer, and is operated as a barrier between the light emitting chip 19 and the protection chip 29. Thus, although the light emitting chip 19 is adjacent to or spaced apart from the protection chip 29, there is not almost any optical loss by the protection chip 29.

Figure 7:
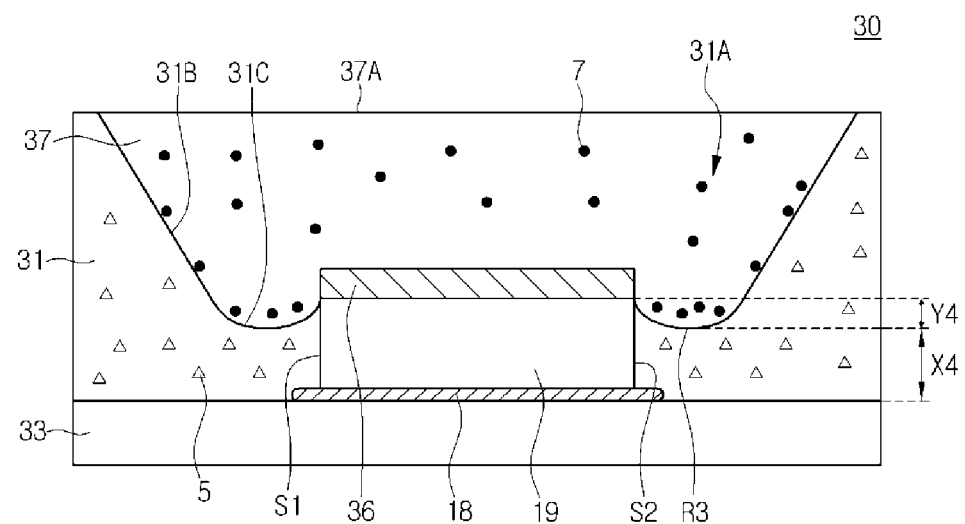
FIG. 7 is a side sectional view showing a light emitting device according to the fourth embodiment.

FIG. 7 is a side sectional view showing a light emitting device according to the fourth embodiment. In the following description of the fourth embodiment, the description about the first embodiment will be incorporated by reference.

Referring to FIG. 7, the light emitting device 30 includes a lead frame 33, a first molding member 31, a second molding member 37, a phosphor layer 36, and a light emitting chip 19.

The first molding member 31 is disposed on the lead frame 33. The lead frame 33 forms a cavity 31A and performs a function of a body as in FIG. 2. The first molding member 31 may be formed of silicon material to which a first metal oxide material 5 is added and may be formed by injecting and hardening a liquid material in a mold. An amount of the first metal oxide material 5 may be added to the first molding member 31 in the range of 5 wt % to 15 wt % or preferably, 10 wt % to 15 wt %. A reflexivity of the first molding member 31 is 70% or more about the peak wavelength of light emitted from the light emitting chip 19, and may be perpendicular or inclined to the top surface of the lead frame 33.

An inner portion 31C of the first molding member 31 is disposed under the cavity 31A. An outer portion 31B of the first molding member 31 may have a predetermined curvature and an inclined surface steeper than that of the inner portion 31C. A top surface of the outer portion 31B of the first molding member 31 has the same height as that of a top surface of the second molding member 17, but the embodiment is limited thereto.

The first molding member 31 includes the inner portion 31C, which is formed at a height lower than that of the light emitting chip 19, around the light emitting chip 19. A top surface R3 of the inner portion 31C includes a concave curved surface. The inner portion 31C of the first molding member 31 may be formed at a height lower than that of a bottom surface of the phosphor layer 36.

The interval X4 between the lowest point of the top surface of the first molding member 31 and a top surface of the lead frame 13 may be in the range of 30% to 70% of the thickness of the light emitting chip 19.

Further, the lowest point of the top surface of the first molding member 31, that is the depth Y4 of the lowest point, may be at a depth in the range of 30% to 70% of the thickness of the light emitting chip 19 from a line horizontally extending from the top surface of the light emitting chip 19. Here, the curvature of the inner portion 31C on the top surface of the first molding member 35 is greater than that of the outer portion 31B, but the embodiment is not limited thereto.

Figure 8:
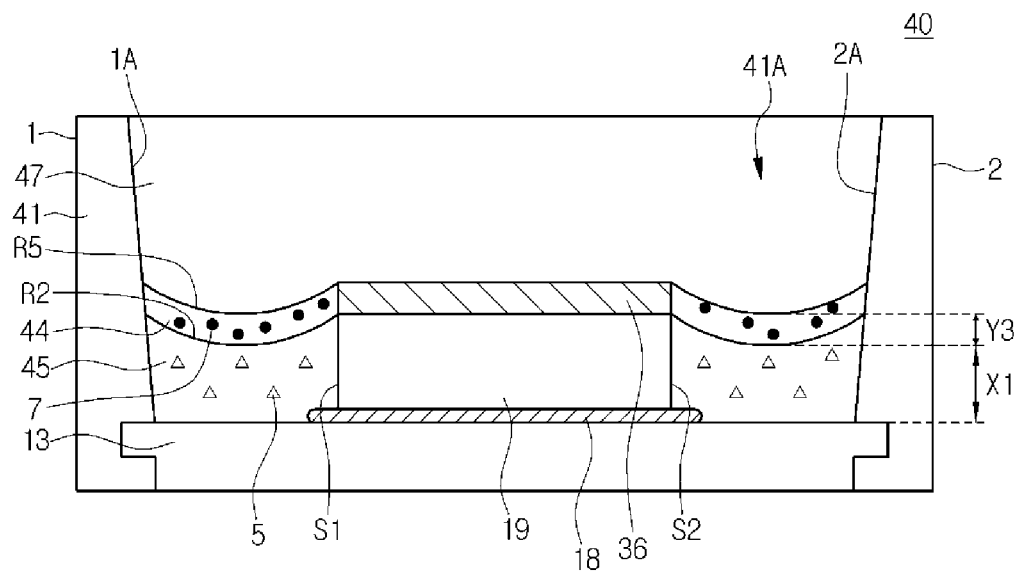
FIG. 8 is a side sectional view showing a light emitting device according to the fifth embodiment.

FIG. 8 is a side sectional view showing a light emitting device according to the fifth embodiment. In the following description of the fifth embodiment, the description about the first embodiment will be incorporated by reference.

Referring to FIG. 8, the light emitting device 40 includes a lead frame 13, a body 41, a first molding member 45, a second molding member 47, a third molding member 44, a phosphor layer 36, and a light emitting chip 19.

The third molding member 44 is disposed between the first and second molding members 45 and 47, and may be formed of silicon including at least one of a first metal oxide material 5 and a second metal oxide material 7. A part of the third molding member 44 is disposed at a position higher than that of the top surface of the light emitting chip 19, and the second metal oxide material 7 may be added as a dispersing agent. The second metal oxide material 7 is added at 10 wt % or less, such that the second metal oxide material 7 is operated as the diffusion layer and effect on the luminous flux or illumination by the third molding member 44 may be reduced.

The third molding member 41 on the top surface of the first molding member 45 has a predetermined curvature and makes contact with the top surface of the first molding member 15. The top surface of the third molding member 44 may be disposed under a line extending from the top surface of the phosphor layer 36. A thickness Y3 of the third molding member 44 may be in the range of 40 μm to 70 μm.

The second molding member 47 may be formed on the third molding member 44 and the phosphor layer 36, and does not make contact with the surface of the light emitting chip 19. Thus, an expansion by thermal transferred from the light emitting chip 19 may be reduced.

Figure 9:
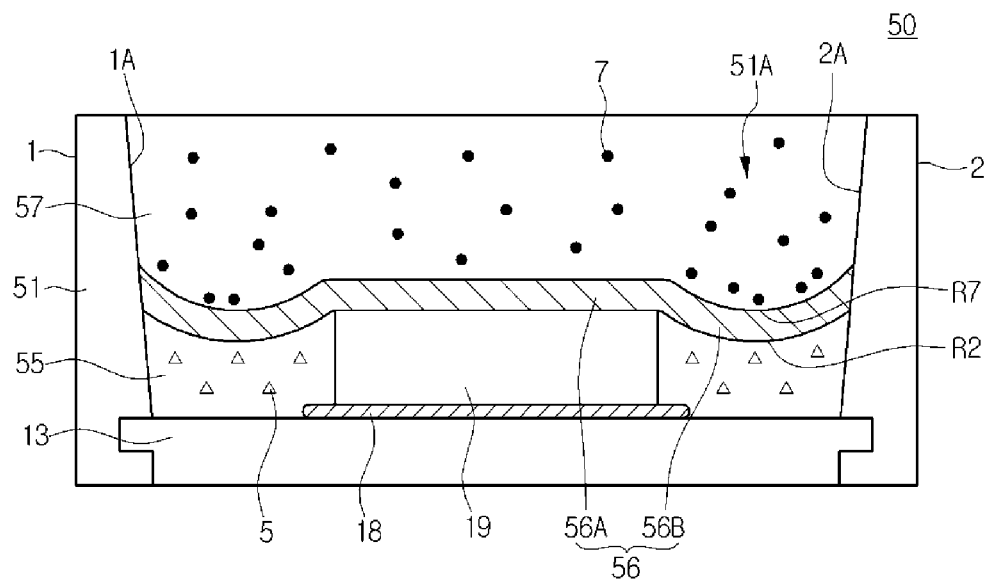
FIG. 9 is a side sectional view showing a light emitting device according to the sixth embodiment.

FIG. 9 is a side sectional view showing a light emitting device according to the sixth embodiment. In the following description of the sixth embodiment, the description about the first embodiment will be incorporated by reference.

Referring to FIG. 9, the light emitting device 50 includes a lead frame 13, a body 51, a first molding member 55, a second molding member 57, a phosphor layer 56, and a light emitting chip 19.

The phosphor layer 56 extends from the top surface of the light emitting chip 19 to the top surface of the first molding member 55. The phosphor layer 56 covers the top surface of the light emitting chip 19 and the top surface R2 of the first molding member 55.

The phosphor layer 56 includes an inner portion 56A and an outer portion 56B. The outer portion 56B of the phosphor layer 56 may make contact with the top surface R2 of the first molding member 55, so that detachment of the inner portion 56A of the phosphor layer 56 may be prevented.

The top surface R7 of the outer portion 56B of the phosphor layer 56 may have a concave curved surface and may make contact with the second molding member 57.

A first metal oxide material 5 is added to the first molding member 55 so that the first molding member 55 is operated as a reflective layer and a second metal oxide material 7 is added to the second molding member 57 so that the second molding member 57 is operated as a diffusion layer.

Figure 10:
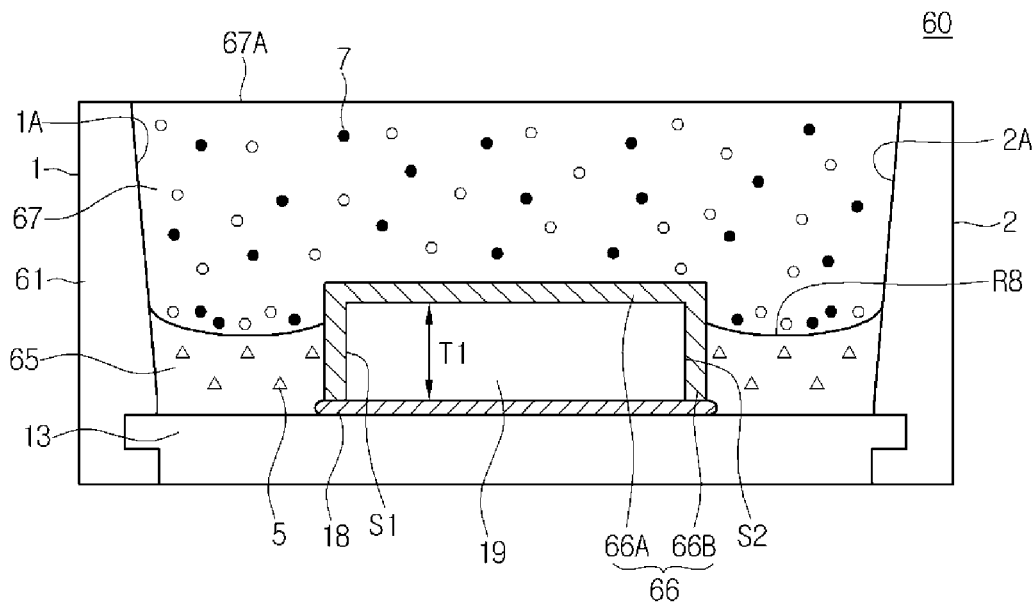
FIG. 10 is a side sectional view showing a light emitting device according to the seventh embodiment.

FIG. 10 is a side sectional view showing a light emitting device according to the seventh embodiment. In the following description of the seventh embodiment, the description about the first embodiment will be incorporated by reference.

Referring to FIG. 10, the light emitting device 60 includes a lead frame 13, a body 61, a first molding member 65, a second molding member 67, a phosphor layer 66, and a light emitting chip 19.

The phosphor layer includes an upper portion 66A disposed on the top surface of the light emitting chip 19 and a side portion 66B disposed on the lateral sides S1 and S2 of the light emitting chip 19. The phosphor layer 66 is adhesive to the top surface and the lateral sides S1 and S2 of the light emitting chip 19, so that a part of light emitted from the light emitting chip 19 to the lateral sides S1 and S2 may be wavelength-converted by the phosphor layer 66 and reflected by the first molding member 65. The thickness of the phosphor layer 66 may be in the range of 40 μm to 70 μm, but the embodiment is not limited thereto.

A first metal oxide material 5 is added to the first molding member 65 so that the first molding member 65 is operated as a reflective layer and a second metal oxide material 7 is added to the second molding member 67 so that the second molding member 57 is operated as a diffusion layer.

The top surface of the first molding member 65 is curved and makes contact with the second molding member 67. The highest point of the top surface of the first molding member 65 may be placed at a position lower than that of a line extending from the top surface of the light emitting chip 19, for example of compound semiconductor layers. Thus, the light emitted in the lateral direction of the light emitting chi 19 may be maximally induced, so that the phosphor layer 66 may perform the wavelength conversion.

Figure 11:
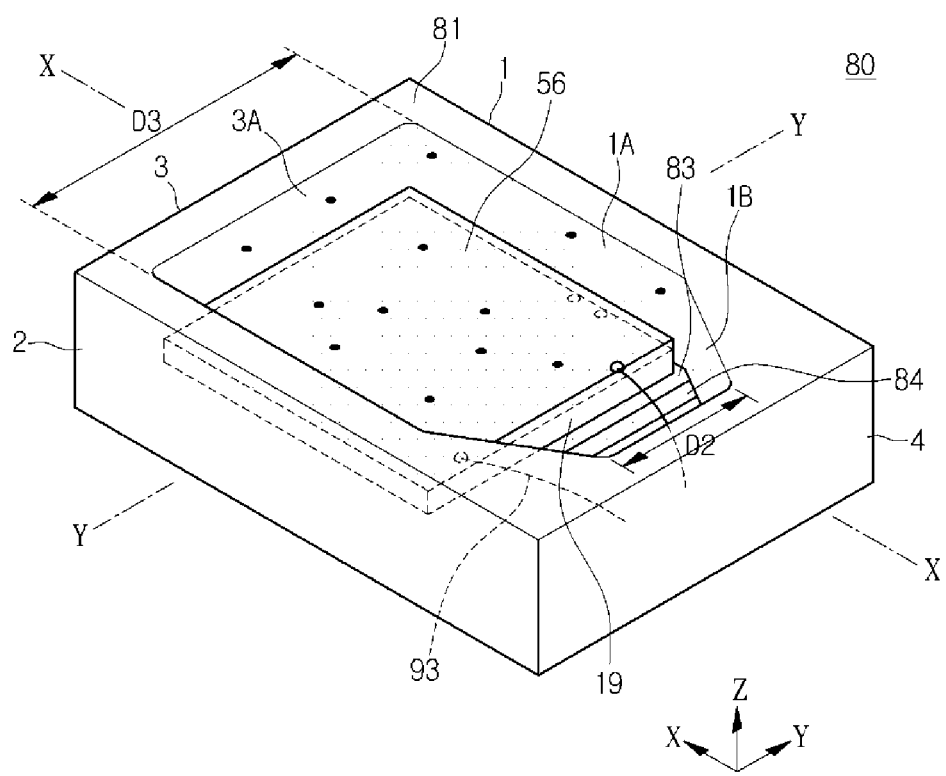
FIGS. 11 to 13 is side sectional views showing a light emitting device according to the eighth embodiment.
Figure 12:
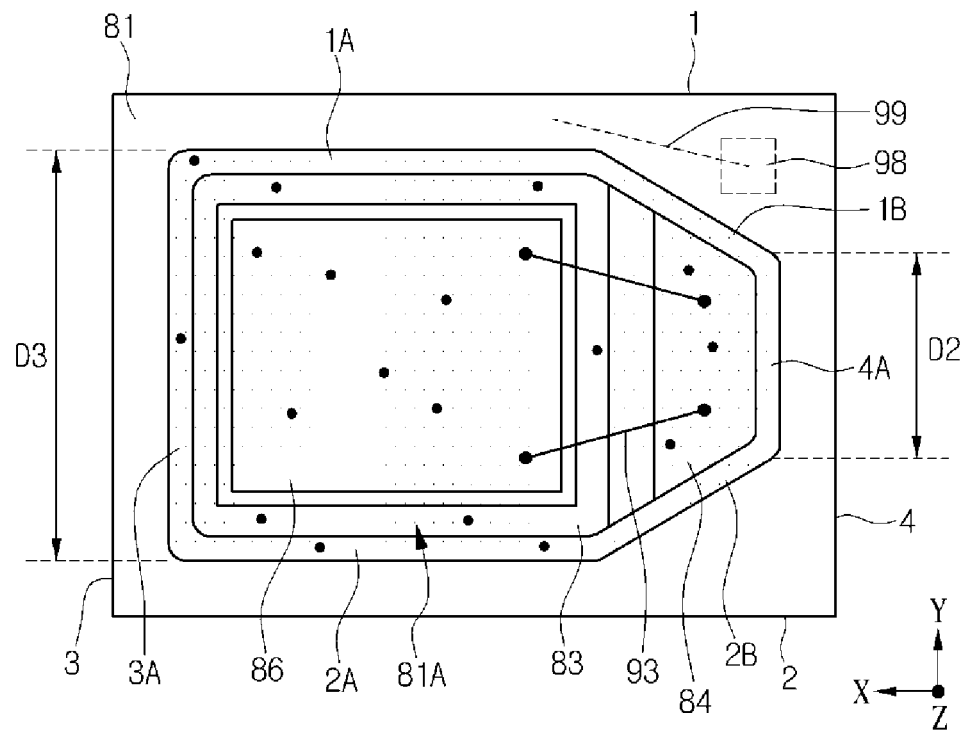
Figure 13:
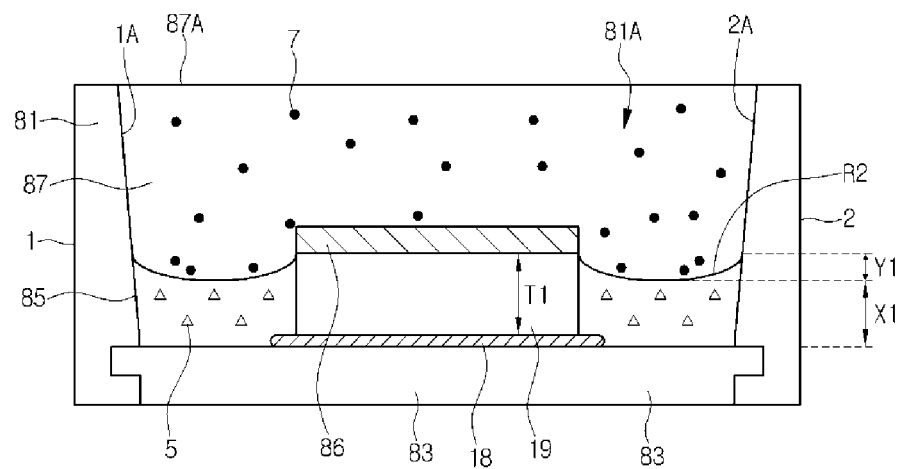

FIGS. 11 to 13 are views showing a light emitting device according to the eighth embodiment.

Referring to FIGS. 11 to 13, the light emitting device includes a body 81 having a cavity 81A, a plurality of lead frames 83 and 84, a first molding member 85, a phosphor layer 86, a second molding member 87, and a light emitting chip 89.

The cavity 81A of the body 81 has a structure in which a width D3 of a third inner lateral side 3A adjacent to a third lateral side 3 of the body 81 is different from a width D2 of a fourth inner lateral side 4A adjacent to a fourth lateral side 4 of the body 81. For example, the width D2 of the fourth inner lateral side 4A is larger than the width D3 of the third inner lateral side 3A. Here, the widths D2 and D3 of the third and fourth inner lateral sides 3A and 4A of the body 81 are equal to a width at a top surface of the body 81 and may be the maximum width.

The body 81 is adjacent to a first lateral side 1 and includes a first inner lateral side 1A which extends from the third inner lateral side 3A, a fifth inner lateral side 1B which is connected between the first inner lateral side 1A and the third inner lateral side 3A, the second inner lateral side 2A which is adjacent to a second lateral side 2 of the body 11 and extends from the first inner lateral side 1A, and a sixth inner lateral side 3B which is connected between the second inner lateral side 2A and the third inner lateral side 3A. The first and second inner lateral sides 1A and 2A may be formed to be parallel with each other, and extending lines from the fifth and sixth inner lateral sides 1B and 3B cross each other. An internal angle between the extending lines may be an obtuse angle, and for example, an angle above 90 degrees but less than 180 degrees. The cavity 81A has an asymmetrical shape about an axis X-X passing through the centers of the first and second inner lateral sides 1A and 2A faced each other and the light emitting chip 89.

The widths of the fifth and sixth inner lateral sides 1B and 3B become narrow toward the fourth inner lateral side 4A, so that an optical directivity angle difference between a first axis X-X passing through a region between the fourth inner lateral side 3A and the light emitting chip 89 and a region between the third inner lateral side 3A and the light emitting chip 89 and a second axis Y-Y perpendicular to the first axis X-X may be reduced.

Further, a protection chip 98 for protecting the light emitting chip 89 is disposed in the body 11 so that optical loss may be reduced.

The protection chip 98 is disposed on the second lead frame 84 in the body 81 in an outer region rather than the first extending lateral side 1B, and connected to the first lead frame 83 through a connection member such as a wire 99 or a pattern. The light emitting chip 89 is disposed on the first lead frame 83 and connected to the second lead frame 84 through a wire 93.

Further, as shown in FIG. 13, the first molding member 85 is disposed around the light emitting chip 89 and may be formed of silicon having the first metal oxide material 5 as a reflective layer. The second molding member 87 may be formed on the first molding member 85 and the light emitting chip 89 of silicon having a second metal oxide material 87 as a diffusion layer. The top surface R2 of the first molding member 85 is concave curved and makes contact with the bottom surface of the second molding member 87. This has been described in detail in the first embodiment.

The first molding member 85 is disposed around the light emitting chip 89 as a reflective layer. A distribution of optical directivity angles of light emitted from the light emitting device 80 is almost equal to directions of the first and second axes X-X and Y-Y and the directivity angle difference between the directions of the first and second axes X-X and Y-Y is 2 degrees or less.

FIGS. 15 and 16 are tables illustrating a luminous flux and an illumination of the embodiment and a comparative example. Here, a silicon material A has a refractive index in the range of 1.52 to 1.54, a silicon material B has refractive index in the range of 1.40 to 1.42, the first molding member is formed of the silicon material A, and the second molding member compares the silicon A with the silicon B.

As shown in FIG. 15, cases #1 and #5 are clear molding cases in which $SiO_2$ and $TiO_2$ are not added to the silicon materials A and B of the first and second molding members, and cases #2 to #4 are cases in which $TiO_2$ is not added to the silicon material A of the first molding member and $SiO_2$ is added to the silicon material A of the second molding member at 7.5%, 10.0% and 12.5%. Cases #6 to #8 are cases in which $TiO_2$ is not added to the silicon material B of the first molding member and $SiO_2$ is added to the silicon material B of the second molding member at 7.5%, 10.0% and 12.5%.

In cases #9 and #16, $TiO_2$ is added to the silicon material A of the first molding member. In cases #9 and #13, $SiO_2$ is not added to the silicon material A of the second molding member. In cases #10 to #12, $SiO_2$ is added to the silicon material A of the second molding member at 7.5%, 10.0% and 12.5%. In cases #14 to #16, $SiO_2$ is added to the silicon material B of the first molding member at 7.5%, 10.0% and 12.5%. In case #9 to #16, $TiO_2$ is added to the silicon material A of the first molding member at 10 wt % or less.

As in cases #10 to #12 of #1 to #16, when the same silicon material is added to the first and second molding members, $TiO_2$ is added and $SiO_2$ is added to the second molding member, the luminous flux (lm) and illumination (Lux) are higher than them of a case that any metal oxide material is not added to the first and second molding members. Further, the case #11 shows more excellent luminous flux (lm) and illumination (Lux) characteristics than that in any other cases. Thus, the luminous flux (lm) and illumination (Lux) of the light emitting device are improved by the first molding member, which reflects light around the light emitting chip, and the second molding member, which spreads light on the light emitting chip. Further, an adhesive strength between the first and second molding members is improved by forming the first and second molding members of the same material, so that a problem derived from the division of the interfacial surface between the first and second molding members may be solved.

Further, as in cases #14 to #16 of #1 to #16, when mutually different silicon materials are added to the first and second molding members, $TiO_2$ is added to the first molding member and $SiO_2$ is added to the second molding member, the luminous flux and illumination are higher than them of a case that any metal oxide material is not added to the first and second molding members. Thus, the luminous flux (lm) and illumination (Lux) of the light emitting device are improved by the first molding member which reflects light around the light emitting chip 89 and the second molding member which spreads light on the light emitting chip 89.

Referring to the directivity angle distribution in FIG. 16, in case #10 to #12, the directivity angles in the first and second axes directions X-X and Y-Y are almost equal to each other. Thus, when the silicon materials of the first and second molding members are the same and the metal oxide materials are different from each other, although a directivity angle distribution is decreased in one direction, the almost same directivity angle distribution may be achieved.

Figure 17:
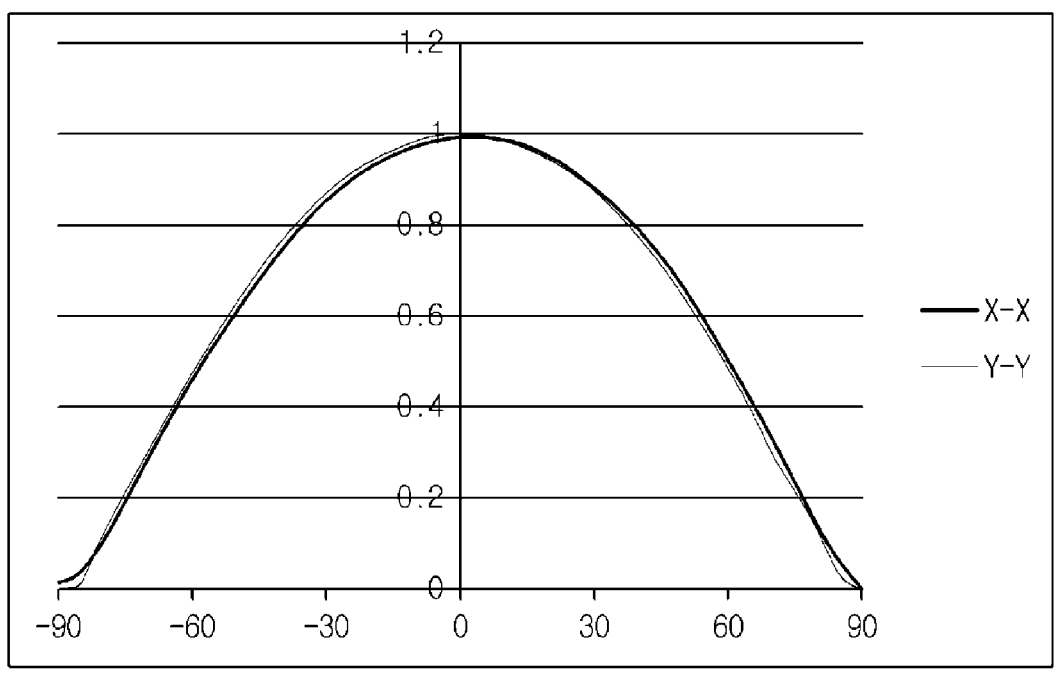
FIG. 17 is a graph illustrating a directivity angle of a light emitting device according to the embodiment.

FIG. 17 is a graph showing directivity angles of cases #10 to #12. As shown in FIG. 17, XX-YY directivity angles are different from each other at 2 degrees or less. In the directivity angle graph in FIG. 17, although the cavity region of the light emitting device of FIG. 11 has an asymmetrical structure, the difference between the XX-YY directivity angles by asymmetry may be reduced by adding the first metal oxide material to the first molding member and the second metal oxide material to the second molding member.

A light emitting chip according to the embodiment will be described with reference to FIG. 14.

Figure 14:
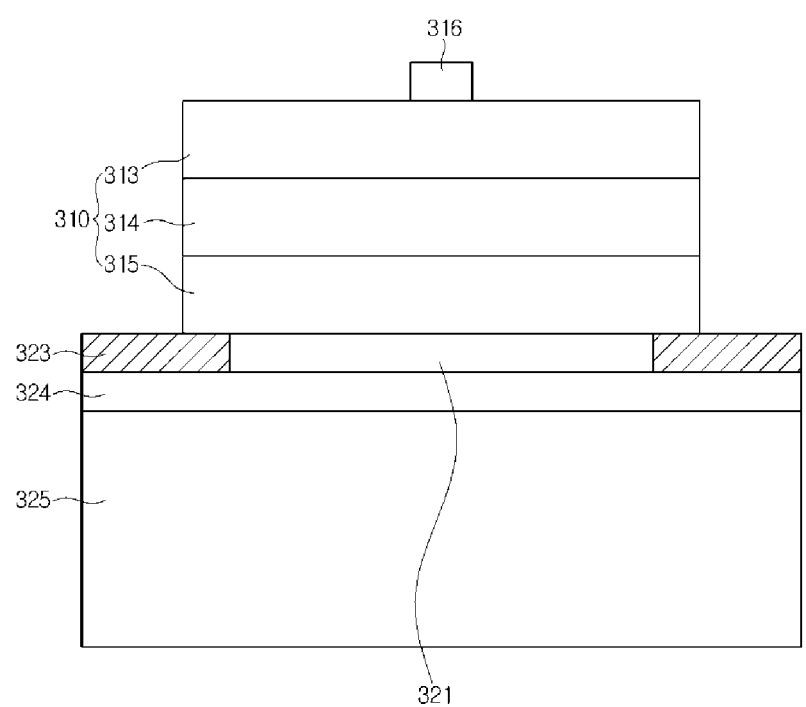
FIG. 14 is a view showing an example of a light emitting chip of a light emitting device according to the embodiment.

FIG. 14 is a view showing a light emitting chip according to the embodiment.

Referring to FIG. 14, the light emitting chip includes a light emitting structure 310, a contact layer 321 formed under the light emitting structure 310, a reflective electrode layer 324 under the contact layer 321, a support member 325 under the reflective electrode layer 324, a protection layer 323 around the reflective electrode layer 324 and the light emitting structure 310, and a first electrode 316.

The light emitting structure 310 includes a first conductive semiconductor layer 313, an active layer 314 and a second conductive semiconductor layer 315.

The first conductive semiconductor layer 313 is implemented by using a group III-V compound semiconductor doped with a first conductive dopant. The first conductive semiconductor layer 313 may be formed of a n-type semiconductor layer including at least one of GaN, InN, AN, InGaN, AlGaN, InAlGaN, AlInN, AlGaAs, GaP, GaAs, GaAsP and AlGaInP, and the first conductive dopant which is an n-type dopant includes Si, Ge, Sn, Se and Te.

A first conductive clad layer may be formed between the first conductive semiconductor layer 315 and the active layer 314. The first conductive clad layer may include a GaN-based semiconductor. The bandgap of the first conductive clad layer is wider than the bandgap of the active layer 314.

The first conductive clad layer may be formed in a first conductive type and confine carriers.

The active layer 314 is formed under the first conductive semiconductor layer 313. The active layer 314 may selectively include a single quantum well structure, a multiple quantum well (MQW) structure, a quantum wire structure, or a quantum dot structure. The active layer 314 may have a period of a well layer and a barrier layer. The well layer may include the compositional formula of $In_xAl_yGa_{1-x-y}N$ ($0 \leq x \leq 1$, $0 \leq y \leq 1$, $0 \leq x+y \leq 1$) and the barrier layer may include the compositional formula of $In_xAl_yGa_{1-x-y}N$ ($0 \leq x \leq 1$, $0 \leq y \leq 1$, $0 \leq x+y \leq 1$). For example, the well/barrier layers may repeat with the periodicity of one or more by using the stack structures of InGaN/GaN, AlGaN/GaN, InGaN/AlGaN, InGaN/InGaN, InAlGaN/AlGaN, or InAlGaN/InAlGaN. The barrier layer may be formed of a semiconductor material which has a bandgap wider than a bandgap of the semiconductor material.

The active layer 314 is formed under the second conductive semiconductor layer 315. The second conductive semiconductor layer 315 may include a semiconductor doped with the second conductive dopant. For example, the second conductive semiconductor layer 315 may be formed of one of GaN, InN, AN, InGaN, AlGaN, InAlGaN, AlInN, AlGaAs, GaP, GaAs, GaAsP, and AlGaInP. The second conductive semiconductor layer 315 is a p type semiconductor layer, and the second conductive dopant may be a p type dopant, such as Mg, Zn, Ca, Sr or Ba.

The second conductive semiconductor layer 315 may include a superlattice structure. The superlattice structure may include a superlattice structure of InGaN/GaN or AlGaN/GaN. The superlattice structure of the second conductive semiconductor layer 315 diffuses a current included in an abnormal voltage so that the active layer 314 may be protected.

Further, a conductive type of the light emitting structure 310 may be inversely disposed. For example, the first conductive semiconductor layer 313 may be prepared as the p type semiconductor layer and the second conductive semiconductor layer 315 may be prepared as the n type semiconductor layer. In addition, a first conductive semiconductor layer having polarity opposite to the second conductive type may be further disposed on the second conductive semiconductor layer 315.

The light emitting structure 310 may have one of an n-p junction structure, a p-n junction structure, an n-p-n junction structure, and a p-n-p junction structure, where the p is a p type semiconductor layer, the n is an n type semiconductor layer, and the "—" denotes a structure that a p type semiconductor layer and an n type semiconductor layer make direct or indirect contact with each other. Hereinafter, for the purpose of convenient description, the highest top layer will be described as the second conductive semiconductor layer 315.

A first electrode 316 is disposed on the first conductive semiconductor layer 313. The top surface of the first conductive semiconductor layer 313 may include a rough uneven structure, but the embodiment is not limited thereto.

The contact layer 321 makes ohmic contact with a bottom layer of the light emitting structure 310, for example the second conductive semiconductor layer 315. A material of the contact layer 321 may be selected from a metal oxide material, a metal nitride, an insulator and a conductive material. For example, the material of the contact layer 321 may be formed of a material selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Ag, Ni, Al, Rh, Pd, Ir, Ru, Mg, Zn, Pt, Au, Hf, and the selective combination thereof. Further, the material of the contact layer 321 may be formed in a multiple layer. For example, the material of the contact layer 321 may be stacked in a structure such as IZO/Ni, AZO/Ag, IZO/Ag/Ni, or AZO/Ag/Ni. A layer for blocking a current to correspond to the first electrode 316 may be further formed in the contact layer 321.

The protection layer 323 may be selectively formed of a metal oxide material or an insulation material selected from ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$. The protection layer 323 may be formed by using a sputtering scheme or a deposition scheme, and a metal such as the reflective electrode layer 324 may prevent layers of the light emitting structure 310 from being short circuited.

For example, the reflective electrode layer 324 may be formed of a material selected from the group consisting of Ag, Ni, Al, Rh, Pd, Ir, Ru, Mg, Zn, Pt, Au and Hf, and the selective combination thereof. The reflective electrode layer 324 may be formed in a size larger than a width of the light emitting structure 310, and may be improved in light reflection efficiency. A metal layer for conjunction between the reflective electrode layer 324 and the support member 325 and a metal layer for thermal diffusion may be further disposed, but the embodiment is not limited thereto.

The support member 325 may be a base substrate, and may be formed of a metal such as Cu, Au, Ni, Mo or Cu—W or a carrier wafer (for example: Si, Ge, GaAs, ZnO, SiC). A conjunction layer between the support member 325 and the reflective electrode layer 324 may be further formed, and may allow two layers to be adhesive to each other. The above-disclosed light emitting chip is one example, and is not limited to the above-disclosed characteristics.

The light emitting chip may be selectively applied to the embodiments of the light emitting device, but the embodiments are not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 18 and 19, a lighting apparatus shown in FIG. 20, a lighting lamp, a camera flash, a signal lamp, a headlamp for a vehicle, and an electronic display.

Figure 18:
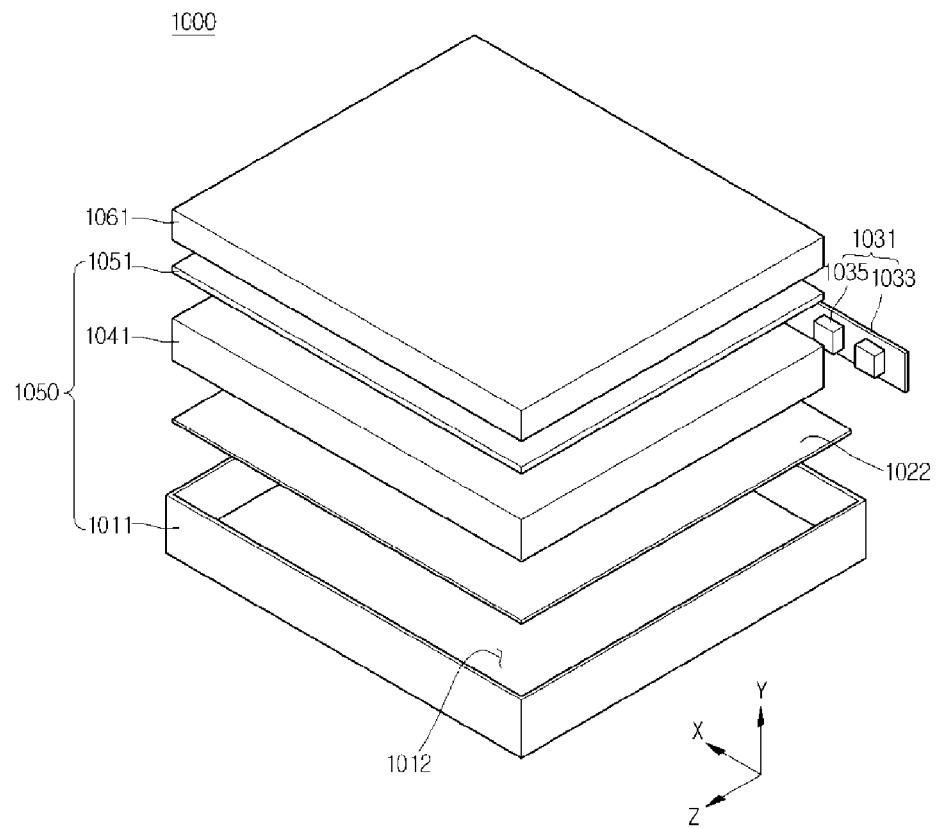
FIG. 18 is a perspective view showing a display apparatus having the light emitting device according to the embodiment.

FIG. 18 is an exploded perspective view showing a display apparatus having the light emitting device according to the embodiment.

Referring to FIG. 18, a display apparatus 1000 according to the embodiment includes a light guide plate 1041, a light source module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light source module 1031 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light source module 1031 is disposed on at least one side of the light guide plate 1041 to supply the light to at least one side of the light guide plate 1041. The light source module 1031 serves as the light source of the display device.

At least one light source module 1031 is disposed to directly or indirectly supply the light from one side of the light guide plate 1041. The light source module 1031 may include a substrate 1033 and the light emitting device according to the embodiments or the light emitting device 1035. The light emitting device or the light emitting device 1035 are arranged on the substrate 1033 while being spaced apart from each other at the predetermined interval.

The substrate 1033 may include a printed circuit board (PCB) including a circuit pattern (not shown). In addition, the substrate 1033 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the substrate 1033 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the substrate 1033, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

Figure 19:
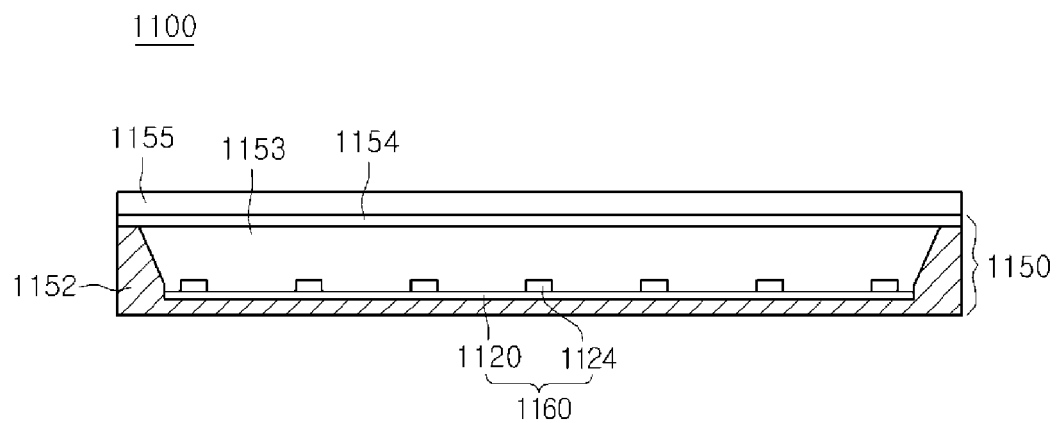
FIG. 19 is a sectional view showing a display apparatus according to the embodiment.

FIG. 19 is a sectional view showing a display apparatus according to the embodiment.

Referring to FIG. 19, the display device 1100 includes a bottom cover 1152, a substrate 1120 on which the light emitting device 1124 are arrayed, an optical member 1154, and a display panel 1155.

The substrate 1120 and the light emitting device 1124 may constitute the light source module 1160. In addition, the bottom cover 1152, at least one light source module 1160, and the optical member 1154 may constitute the light unit. The bottom cover 1151 can be disposed with a receiving section 1153, but the embodiment is not limited thereto. The light source module 1160 includes a substrate 1120, and a plurality of light emitting devices arranged on the substrate 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 20:
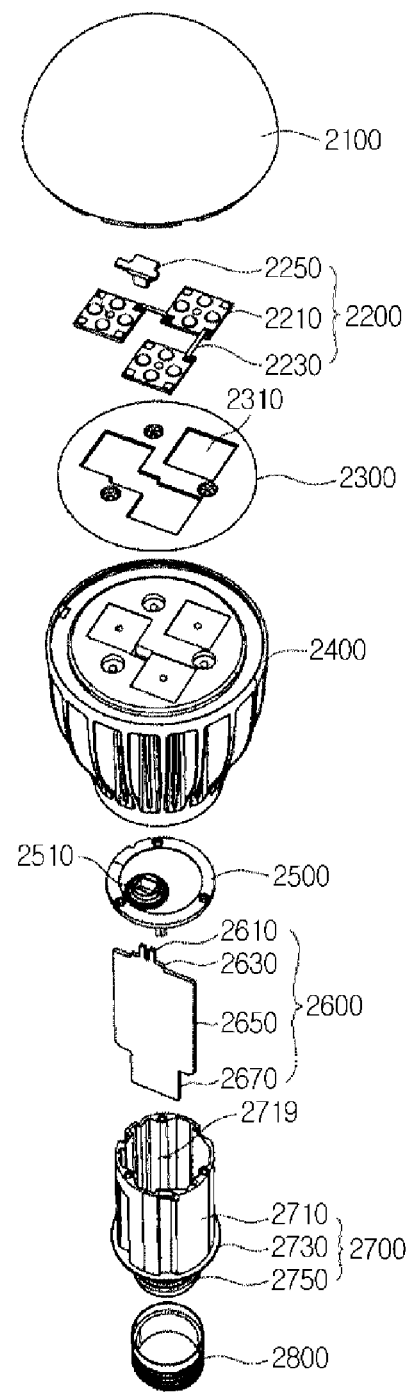
FIG. 20 is an exploded perspective view showing a lighting device having the light emitting device according to the embodiment.

FIG. 20 is an exploded perspective view showing a lighting device having the light emitting device according to the embodiment.

Referring to FIG. 20, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device or the light emitting device package according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light source module 220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The embodiment can improve reliability of a light emitting device having a multiple molding structure. Although the cavity of the light emitting device is asymmetric, the difference between light directivity angles of mutually different axes can be reduced. The light emitting device and the lighting apparatus having the same according to the embodiment can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body having a cavity;
a plurality of lead frames in the cavity;
a light emitting chip on at least one of the lead frames;
a first molding member around the light emitting chip, in which a first metal oxide material is added to the first molding member; and
a second molding member on the first molding member and the light emitting chip, in which a second metal oxide material is added to the second molding member,
wherein the light emitting chip comprises:
a light emitting structure including a plurality of compound semiconductor layers; and
a reflective electrode layer under the light emitting structure,
wherein a top surface of the first molding member extends from a region between a top surface of the light emitting chip and a lateral side of the reflective electrode layer at a predetermined curvature,
wherein a bottom surface of the second molding member corresponding to the top surface of the first molding member includes a curved surface which is convex toward the first molding member, wherein a lowest point of the top surface of the first molding member is disposed lower than a top surface of the light emitting chip, and wherein a portion of the top surface of the first molding member is disposed over the reflective electrode layer.

2. The light emitting device of claim 1, wherein the top surface of the first molding member is disposed between the light emitting chip and an inner lateral side of the cavity.

3. The light emitting device of claim 1, wherein the top surface of the first molding member extends from the top surface of the light emitting chip, and the top surface of the first molding member is disposed lower than the top surface of the light emitting chip.

4. The light emitting device of claim 1, wherein the top surface of the first molding member extends to an inner lateral side of the cavity.

5. The light emitting device of claim 4, wherein a height of the inner lateral side of the cavity, which makes contact with the top surface of the first molding member, is equal to a height of the top surface of the light emitting chip.

6. The light emitting device of claim 1, wherein the top surface of the first molding member is a curved surface concaved toward a bottom surface of the first molding member, and a depth of the curved surface is in a range of 30% to 70% of a thickness of the light emitting chip from a horizontal line extending from the top surface of the light emitting chip.

7. The light emitting device of claim 1, wherein the top surface of the first molding member has a curvature in a range of 0.05 mm to 1 mm.

8. The light emitting device of claim 7, wherein the bottom surface of the second molding member corresponding to the top surface of the first molding member has a curvature equal to the curvature of the top surface of the first molding member.

9. The light emitting device of claim 1, wherein a top surface of the second molding member has a curvature greater than a curvature of the top surface of the first molding member.

10. The light emitting device of claim 1, wherein the first metal oxide material has a refractive index different from a refractive index of the second metal oxide material, and an amount of the first and second metal oxide materials added to the first and second molding members is in a range of 5 wt % to 15 wt %.

11. The light emitting device of claim 1, further comprising a phosphor in the second molding member.

12. A light emitting device comprising:
a body having a cavity;
a plurality of lead frames in the cavity;
a light emitting chip on at least one of the lead frames;
a first molding member around the light emitting chip, in which a first metal oxide material is added to the first molding member; and
a second molding member on the first molding member and the light emitting chip, in which a second metal oxide material is added to the second molding member,
wherein the light emitting chip comprises:
a light emitting structure including a plurality of compound semiconductor layers; and
a reflective electrode layer under the light emitting structure,
wherein a top surface of the first molding member is disposed lower than a top surface of the light emitting chip,
wherein a difference in intervals between a highest point of the top surface of the first molding member and a bottom surface of the cavity and between a lowest point of the top surface of the first molding member and the bottom surface of the cavity is in a range of 30% to 70% of a thickness of the light emitting chip, and
wherein a portion of the top surface of the first molding member is disposed over the reflective electrode layer.

13. The light emitting device of claim 12, wherein the top surface of the first molding member is disposed between the light emitting chip and an inner lateral side of the cavity, and the top surface of the first molding member extends from the top surface of the light emitting chip, and the top surface of the first molding member is disposed between a top surface of the light emitting structure and a bottom surface of the light emitting structure.

14. The light emitting device of claim 12, wherein the top surface of the first molding member extends to an inner lateral side of the cavity.

15. The light emitting device of claim 14, wherein a height of the inner lateral side of the cavity which makes contact with the top surface of the first molding member is equal to a height of the top surface of the light emitting chip.

16. The light emitting device of claim 12, wherein the top surface of the first molding member has a curvature in a range of 0.05 mm to 1 mm.

17. The light emitting device of claim 12, wherein the first metal oxide material has a refractive index different from a refractive index of the second metal oxide material, and an amount of the first and second metal oxide materials added to the first and second molding members is in a range of 5 wt % to 15 wt %.

18. The light emitting device of claim 12, wherein the body includes a material which is equal to a material of the first and second molding members.

19. The light emitting device of claim 12, further comprising a phosphor layer between the light emitting chip and the second molding member.

20. The light emitting device of claim 12, wherein the second molding member has a thickness greater than a maximum thickness of the first molding member.

* * * * *